United States Patent
Kobayashi et al.

(10) Patent No.: US 12,189,285 B2
(45) Date of Patent: Jan. 7, 2025

(54) DROPLET RECIPE CREATION METHOD, PATTERN FORMATION METHOD, AND MANUFACTURING METHOD OF SEMICONDUCTOR DEVICE

(71) Applicant: KIOXIA CORPORATION, Tokyo (JP)

(72) Inventors: Ryo Kobayashi, Kawasaki Kanagawa (JP); Akihiko Ando, Machida Tokyo (JP)

(73) Assignee: Kioxia Corporation, Tokyo (JP)

( * ) Notice: Subject to any disclaimer, the term of this patent is extended or adjusted under 35 U.S.C. 154(b) by 250 days.

(21) Appl. No.: 17/682,827

(22) Filed: Feb. 28, 2022

(65) Prior Publication Data

US 2023/0088435 A1    Mar. 23, 2023

(51) Int. Cl.
  *G03F 7/00*    (2006.01)
  *G03F 7/20*    (2006.01)
  *H01L 21/027*  (2006.01)

(52) U.S. Cl.
  CPC .......... *G03F 7/0002* (2013.01); *G03F 7/2018* (2013.01); *H01L 21/0274* (2013.01)

(58) Field of Classification Search
  None
  See application file for complete search history.

(56) References Cited

U.S. PATENT DOCUMENTS

| | | | |
|---|---|---|---|
| 8,420,422 B2 | 4/2013 | Asano et al. | |
| 8,740,377 B2 | 6/2014 | Mikami et al. | |
| 10,192,793 B2 | 1/2019 | Izawa | |
| 10,406,743 B2 | 9/2019 | Yamaguchi et al. | |
| 2010/0187714 A1* | 7/2010 | Kobiki | B82Y 40/00 264/135 |
| 2010/0233377 A1* | 9/2010 | Aoki | B29C 59/022 427/355 |

(Continued)

FOREIGN PATENT DOCUMENTS

| | | |
|---|---|---|
| JP | 2010083020 A | 4/2010 |
| JP | 2011199052 A | 10/2011 |

(Continued)

OTHER PUBLICATIONS

Japanese Office Action dated Nov. 12, 2024, mailed in counterpart Japanese Application No. 2021-154189, 10 pages (with translation).

*Primary Examiner* — Shamim Ahmed
(74) *Attorney, Agent, or Firm* — Kim & Stewart LLP

(57) ABSTRACT

According to one embodiment, a method for generating a droplet recipe used in imprint lithography includes acquiring feature data for a pattern shape that has been formed on a template. The feature data is acquired by measuring the pattern shape of a pattern that has been formed on the template. A dispensing amount for resin to be dispensed on a substrate for filling of the pattern of the template during imprinting of the pattern of the template on the substrate is calculated, based on the acquired feature data. A dispensing amount for resin corresponding to a target thickness of a residual film formed on the substrate during the imprinting of the pattern of the template on the substrate is also calculated. A droplet recipe for dispensing of resin during imprinting of the pattern of the template is then generated based on the calculated dispensing amounts.

17 Claims, 14 Drawing Sheets

(56) References Cited

U.S. PATENT DOCUMENTS

| | | | |
|---|---|---|---|
| 2010/0308485 A1* | 12/2010 | Inanami | B82Y 10/00 |
| | | | 425/150 |
| 2013/0249981 A1* | 9/2013 | Nakagawa | G03F 7/0002 |
| | | | 347/9 |
| 2014/0153003 A1 | 6/2014 | Miyakawa et al. | |
| 2016/0271845 A1* | 9/2016 | Yamazaki | G03F 7/0002 |
| 2017/0140922 A1 | 5/2017 | Iwasaki et al. | |
| 2017/0252775 A1 | 9/2017 | Tamura et al. | |
| 2017/0263510 A1* | 9/2017 | Baba | H01L 21/0271 |
| 2020/0174362 A1* | 6/2020 | Khusnatdinov | B29C 59/02 |

FOREIGN PATENT DOCUMENTS

| | | |
|---|---|---|
| JP | 2012054322 A | 3/2012 |
| JP | 2014110308 A | 6/2014 |
| JP | 2015213130 A | 11/2015 |
| JP | 2017092350 A | 5/2017 |
| JP | 2017162875 A | 9/2017 |
| JP | 2018121004 A | 8/2018 |
| JP | 2018133379 A | 8/2018 |
| JP | 2018195811 A | 12/2018 |

* cited by examiner

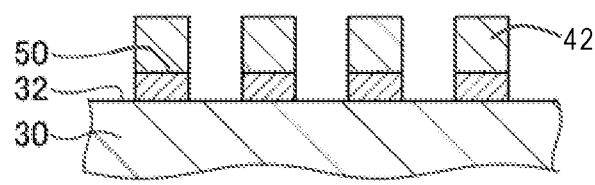
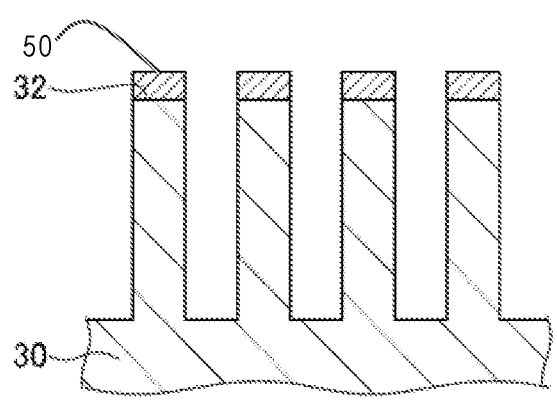
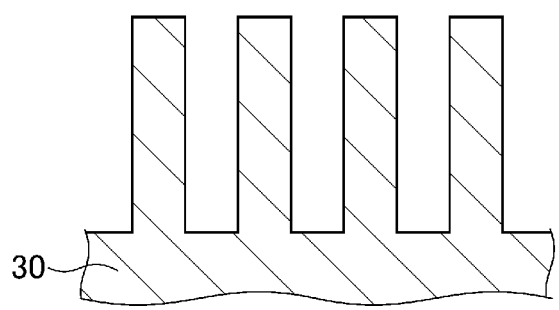

| (PM$_1$) $\alpha_1$ | (PM$_2$) $\alpha_2$ | (PM$_3$) $\alpha_3$ | (PM$_4$) $\alpha_4$ |
|---|---|---|---|
| (PM$_5$) $\alpha_5$ | (PM$_6$) $\alpha_6$ | (PM$_7$) $\alpha_7$ | (PM$_8$) $\alpha_8$ |
| (PM$_9$) $\alpha_9$ | (PM$_{10}$) $\alpha_{10}$ | (PM$_{11}$) $\alpha_{11}$ | (PM$_{12}$) $\alpha_{12}$ |
| (PM$_{13}$) $\alpha_{13}$ | (PM$_{14}$) $\alpha_{14}$ | (PM$_{15}$) $\alpha_{15}$ | (PM$_{16}$) $\alpha_{16}$ |

| 1.0 | 1.0 | 1.0 | 1.5 |
|---|---|---|---|
| 1.0 | 1.5 | 1.0 | 0.5 |
| 1.0 | 1.5 | 1.0 | 0.5 |
| 1.0 | 1.5 | 1.0 | 1.0 |

DROPLET RECIPE CREATION METHOD, PATTERN FORMATION METHOD, AND MANUFACTURING METHOD OF SEMICONDUCTOR DEVICE

CROSS-REFERENCE TO RELATED APPLICATION

This application is based upon and claims the benefit of priority from Japanese Patent Application No. 2021-154189, filed Sep. 22, 2021, the entire contents of which are incorporated herein by reference.

FIELD

Embodiments described herein relate generally to a method of creating a droplet recipe for an imprint lithography technique, a pattern formation method utilizing imprint lithography, and a method of manufacturing a semiconductor device using imprint lithography.

BACKGROUND

As a method of making a fine pattern on a substrate, nanoimprint lithography is known. In nanoimprint lithography, a resist is dispensed onto a substrate according to a droplet recipe, and then a nanoimprint template (mold) is pressed against the resist dispensed on the substrate. The droplet recipe can be established based on the design information regarding the pattern that has been formed on the imprint template. After resist is cured by irradiating with ultraviolet light, and the template is separated from the resist to leave a pattern corresponding to the template on the substrate.

BRIEF DESCRIPTION OF THE DRAWINGS

FIGS. 7A to 7C are cross-sectional views showing aspects related to imprint processing of a first embodiment.

FIGS. 13A and 13B are diagrams showing an example of a correction map of a first embodiment.

DETAILED DESCRIPTION

Figure 1:
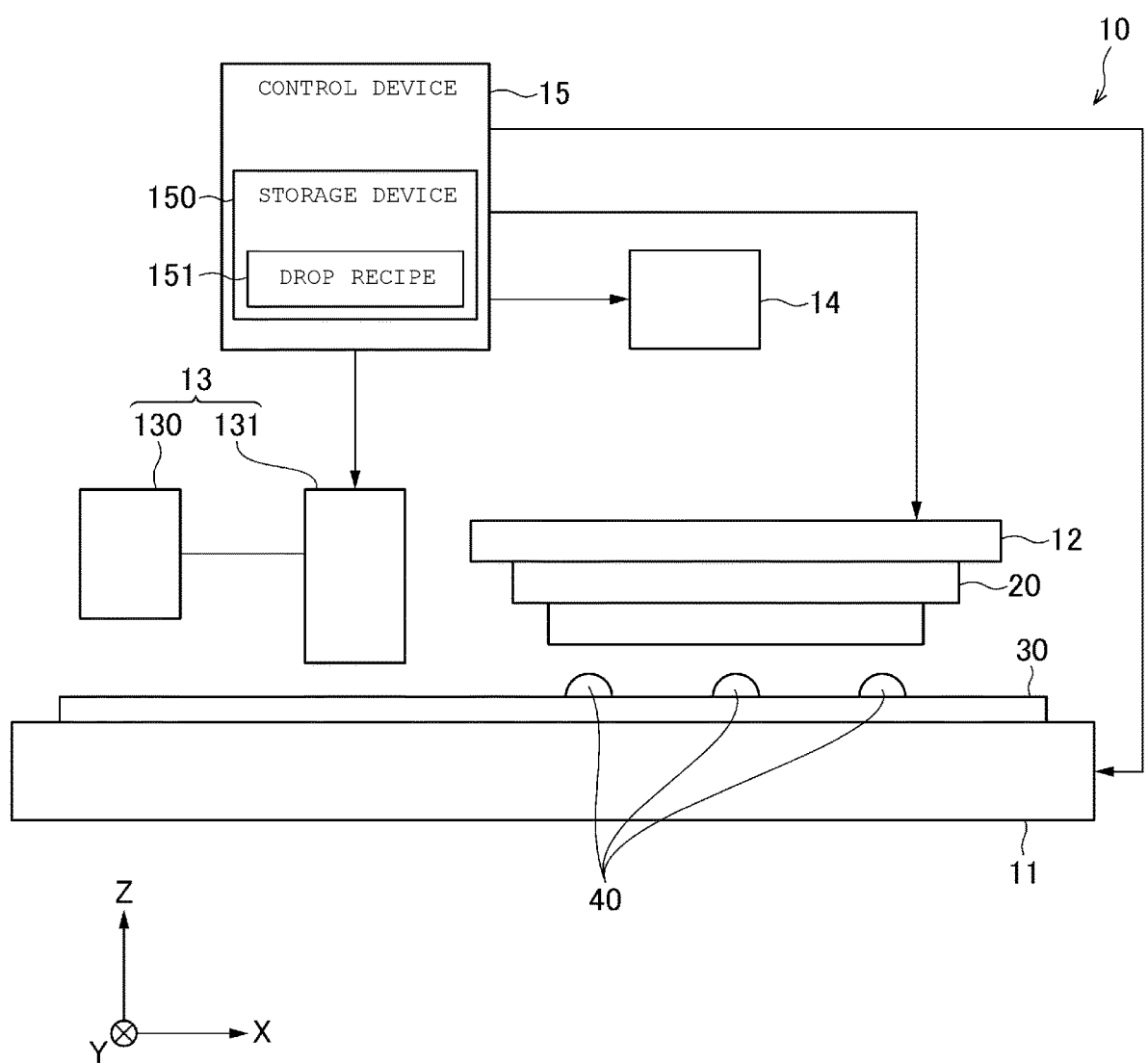
FIG. 1 is a block diagram of an imprint device according to a first embodiment.

Due to process variations in the template manufacturing process, or the like, the shapes finally formed on the template may deviate from the ideal shape that matches the design value. In view of such deviations from design values, the amount of resist dispensed in the imprint process based on design values may cause unintended patterning performance on the substrate, such as too little or too much resist in certain areas of the pattern.

Example embodiments describe a creation method for an improved droplet ("drop") recipe and a pattern formation method utilizing the improved droplet recipe. A manufacturing method for a semiconductor device utilizing these methods is also described.

In general, according to one embodiment, a method for generating a droplet recipe to be used in imprint lithography process includes: acquiring feature data for a pattern shape formed on a template by measuring the pattern shape of a pattern formed on the template; calculating, based on the acquired feature data, a dispensing amount for resin to be dispensed on a substrate for filling of the pattern of the template during imprinting of the pattern of the template on the substrate; and calculating a dispensing amount for resin corresponding to a target thickness of a residual film portion formed on the substrate during the imprinting of the pattern of the template on the substrate. The droplet recipe for dispensing of resin during imprinting of the pattern of the template is then generated based on the calculated dispensing amounts.

Hereinafter, certain embodiments will be described with reference to the drawings. The same elements in different drawings are designated by the same reference numerals, and, in general, duplicate description of such elements may be omitted after an initial description.

First Embodiment

Schematic Configuration of Imprint Device

An imprint device 10 shown in FIG. 1 is a device for performing an imprint processing of molding a resist 40 on a transfer destination substrate 30 ("substrate 30") using a master template 20. The resist 40 is made of resin. A replica template is formed by subjecting the substrate 30 on which the resist 40 has been molded to an etching processing or the like. The replica template is then used to form a pattern on a silicon wafer or the like in a manufacturing process of a semiconductor device. By creating a plurality of replica templates from the master template 20, it is possible to improve manufacturing productivity.

As shown in FIG. 1, the imprint device 10 includes a substrate stage 11, a template stage 12, a coating device 13, an irradiation unit 14, and a control device 15.

Figure 2:
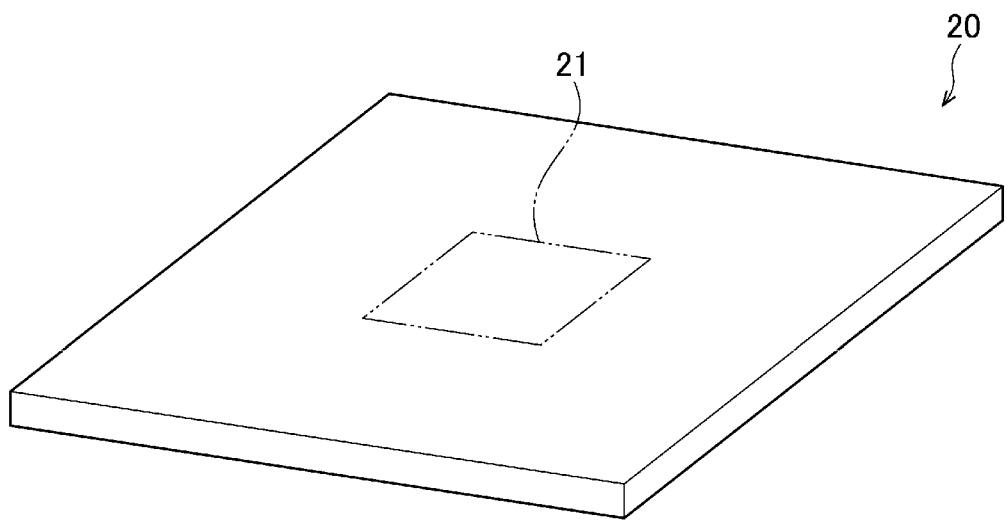
FIG. 2 is a perspective view of a master template of a first embodiment.

The master template 20 and the substrate 30 are made of a material capable of transmitting ultraviolet light such as quartz glass. A pattern portion 22 (shown in FIG. 3) is formed in a predetermined shot area 21 (shown in FIG. 2) on the surface of the master template 20 by, for example, an electron beam lithography method. The shape of the pattern portion 22 inversely corresponds to the final shape of the resist 40 after molding (imprinting) on the substrate 30. In the present embodiment, the shape of the pattern portion 22 corresponds to an intended device pattern shape.

Figure 4:
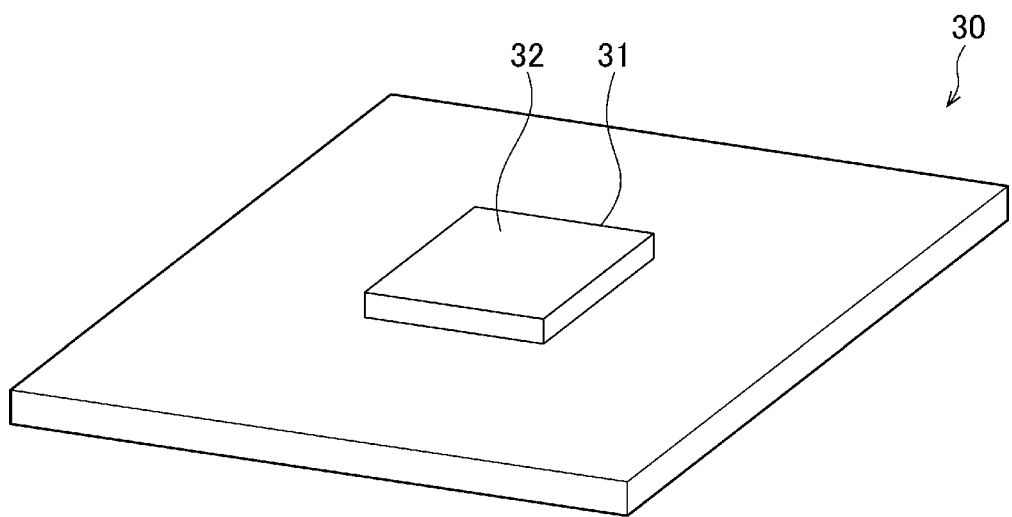
FIG. 4 is a perspective view of a transfer destination substrate of a first embodiment.

As shown in FIG. 4, the substrate 30 has a mesa portion 31 protruding from other portions. The upper surface of the mesa portion 31 is a transfer surface 32 on to which the pattern portion 22 of the master template 20 is transferred.

The substrate stage 11, shown in FIG. 1, holds the substrate 30 by a vacuum suction force, an electrostatic force, or the like. The substrate stage 11 has a function of displacing the substrate 30 in the X and Y directions, a function of positioning the substrate 30, or the like.

The template stage 12 holds the master template 20 by a vacuum suction force, an electrostatic force, or the like. The template stage 12 has a function of displacing the master template 20 in the Z direction. As a result, it is possible to bring the pattern portion 22 of the master template 20 into contact with the resist 40 on the substrate 30 and then to separate the master template 20 from the resist 40.

The coating device 13 is a device that applies the resist 40 on the substrate 30. The coating device 13 has a supply unit 130 and a dispenser 131. The supply unit 130 supplies the resist 40, as an uncured resin (or resin precursor), to the dispenser 131. The dispenser 131 has a plurality of nozzles, and dispenses the resist 40 from the nozzles onto the substrate 30. The volume unit for the dispensing amount from the dispenser 131 can be referred to as a "drop" or a "droplet", and the volume of each drop is approximately several picolitres in this example.

During the imprint processing, the irradiation unit 14 cures the resist 40 by irradiating the resist 40 with ultraviolet light.

The control device 15 may include a microcomputer having a CPU, a storage device 150, and the like. The storage device 150 stores a drop recipe 151 or the like. The drop recipe 151 shows the dropping position, dropping amount, and the like for the resist 40 dispensed on to the substrate 30. The control device 15 controls the substrate stage 11, the template stage 12, the coating device 13, and the irradiation unit 14 based on the drop recipe 151.

Next, an operation example of the imprint device 10 will be described.

Figure 5:
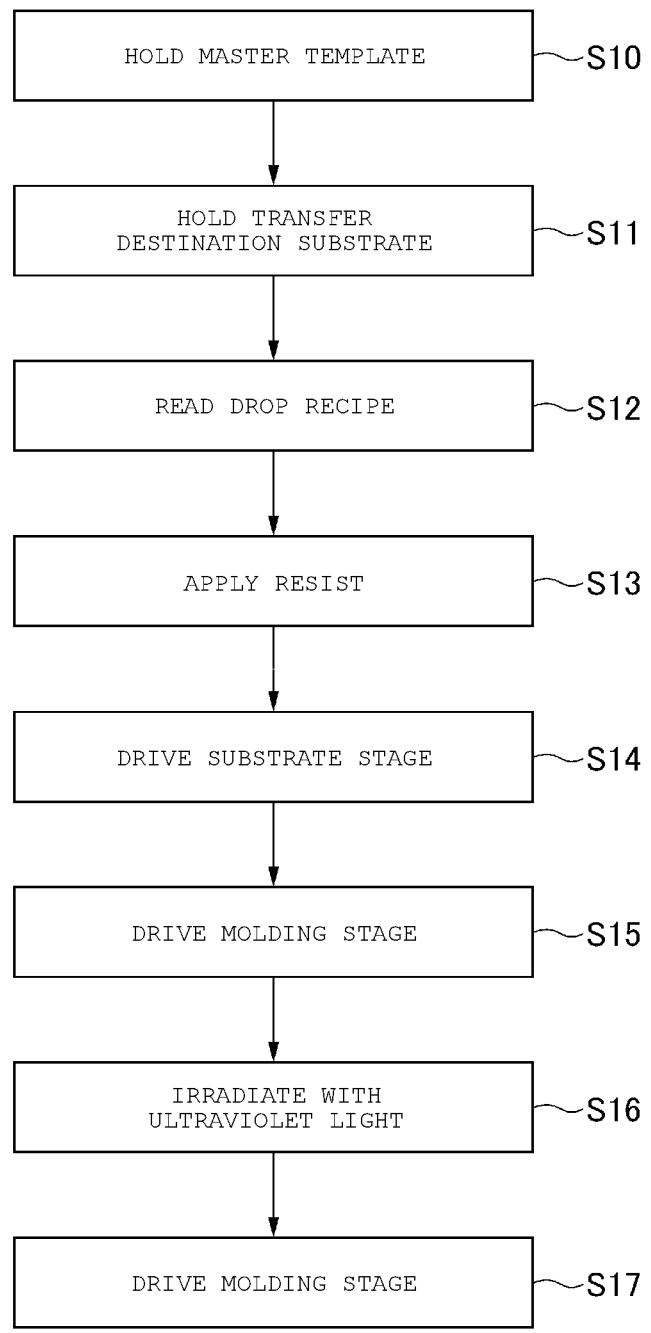
FIG. 5 is a flowchart of imprint processing according to a first embodiment.
Figure 6A:
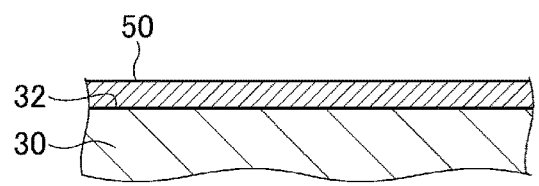
FIGS. 6A to 6D are cross-sectional views showing aspects related to imprint processing of a first embodiment.

As shown in FIG. 5, the control device 15 first controls the template stage 12 to hold the master template 20 (step S10), and then (or concurrently) controls the substrate stage 11 to hold the substrate 30 (step S11). As shown in FIG. 6A, a hard mask 50 is formed as a thin film on the transfer surface 32 of the substrate 30. The hard mask 50 helps prevent the substrate 30 (comprising quartz glass) from being etched when removing unnecessary resist 40 (e.g., residual layer portions of resist 40 left between/below pattern portions 22) from the substrate 30.

Subsequently, as shown in FIG. 5, the control device 15 reads the drop recipe 151 stored in the storage device 150 (step S12), and then applies the resist 40 on the substrate 30 based on the drop recipe 151 (step S13). Specifically, the control device 15 controls the ejection of droplets from each nozzle of the dispenser 131 based on the drop recipe 151 while moving the substrate 30 in the X direction.

Figure 6B:
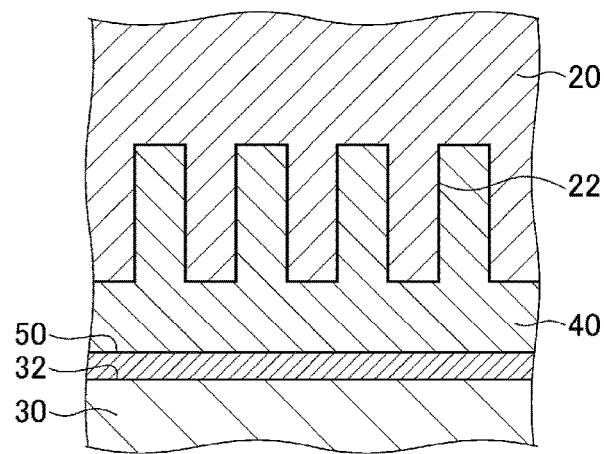

Next, the control device 15 drives the substrate stage 11 to move the area applied with the resist 40 on the substrate 30 to a position directly under the master template 20 as shown in FIG. 1 (step S14). Then, the control device 15 drives the template stage 12 to bring the master template 20 closer to the substrate 30 and presses the pattern portion 22 of the master template 20 against the resist 40 on the substrate 30 (step S15). As a result, as shown in FIG. 6B, the resist 40 flows into and fills the pattern portion 22 of the master template 20 with the passage of time.

Figure 6C:
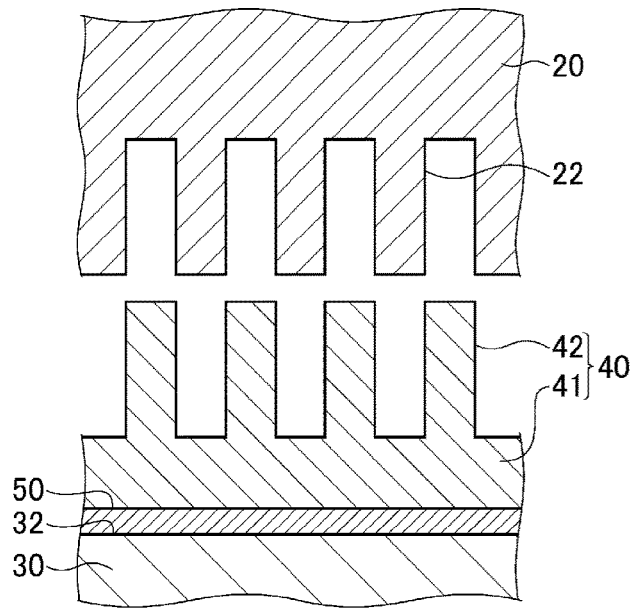

After this, as shown in FIG. 5, the control device 15 drives the irradiation unit 14 to irradiate the resist 40 on the substrate 30 with ultraviolet light for a predetermined time to cure the resist 40 (step S16). The control device 15 then separates the master template 20 from the substrate 30 by driving the template stage 12 (step S17). As a result, the resist 40 having a shape as shown in FIG. 6C is formed on the substrate 30. The resist 40 has a residual film portion 41 and a patterned portion 42 protruding from the residual film portion 41. In the present embodiment, the patterned portions 42 correspond to the transfer pattern portion.

Figure 6D:
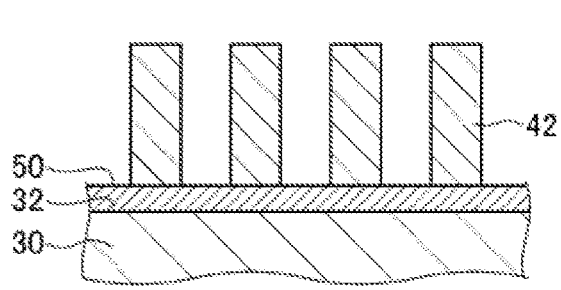

After the resist 40 is molded on the substrate 30 in this way, processing is performed to remove portions of the resist residual film portion 41 between the patterned resist portions 42. As a result, as shown in FIG. 6D, in effect, only a part of the patterned resist portions 42 are left on the transfer surface 32 of the substrate 30, and a portion of the hard mask 50 is exposed by removal of the portions of the residual film portion 41 between the patterned resist portions 42.

Subsequently, as shown in FIG. 7A, a portion of the transfer surface 32 of the substrate 30 is exposed by removing the exposed portions of hard mask 50, and then etching processing is performed on the exposed transfer surface 32 of the substrate 30. As a result, a recess is etched in the substrate 30 as shown in FIG. 7B. At this time, the patterned resist portions 42 disappears or remains slightly. After that, by removing the hard mask 50 from the substrate 30, a projecting portion remains in the substrate where the patterned resist portions 42 were present, as shown in FIG. 7C. The substrate 30 has concave (recessed) portions at positions where the patterned resist portions 42 were not present. In this way, the replica template pattern is formed on the substrate 30.

Figure 8A:
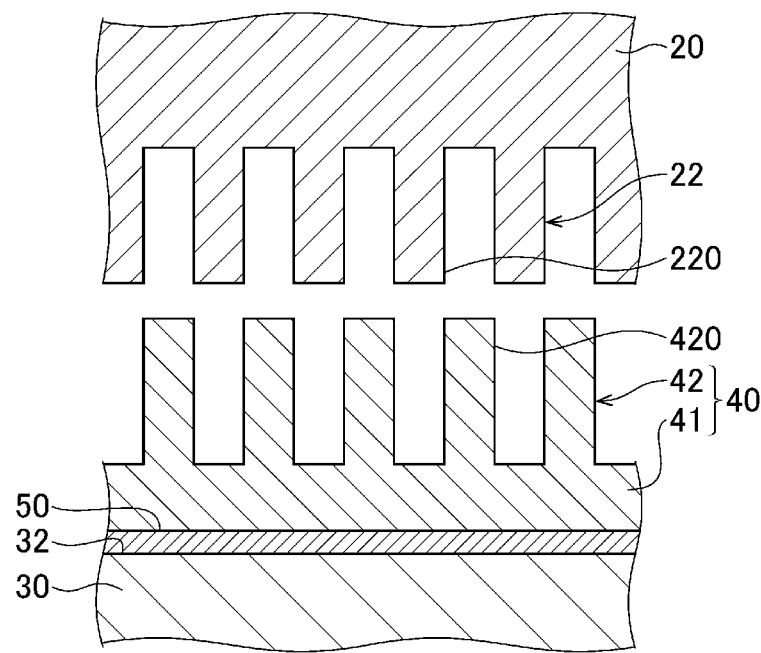
FIGS. 8A and 8B are cross-sectional views of a master template and a transfer destination substrate of a first embodiment.
Figure 8B:
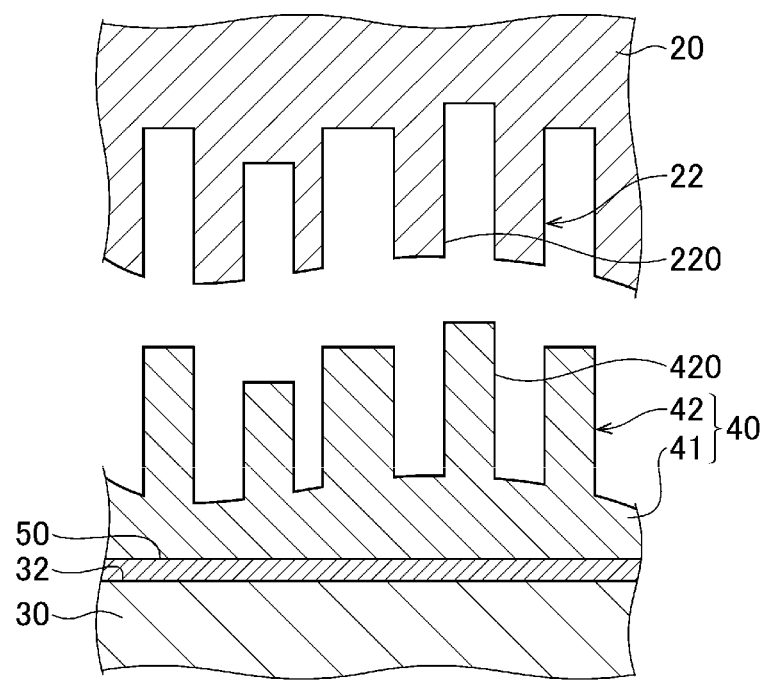

When forming a replica template through the above processes, when the pattern portion 22 of the master template 20 has an ideal shape matching design data as shown in FIG. 8A, the film thickness of the resist residual film portion 41 tends to be substantially uniform, so that it is possible to manufacture a more accurate replica template. However, in reality, the dimensions and the etched depth of the pattern portion 22 of the master template 20 usually vary from ideal/design due to assorted variations in process accuracy when molding and transferring the pattern portion 22 on the master template 20, or the like. As a result, as shown in FIG. 8B, there is a possibility that the shape of the pattern portion 22 of the master template 20 deviates from the ideal shape. In such a case, when the resist 40 is applied on the substrate 30 using the drop recipe 151 established based on the ideal master template 20 (e.g., the design data for the pattern and expected etch depths), a mismatch occurs between the shape of the pattern portion 22 of the actual master template 20 and the volume of the resist 40 applied on the substrate 30 according to ideal/design data. As a result, the resist 40 may have an unintended thickness and shape on the substrate 30 and the molding accuracy of the replica template being formed may decrease.

Accordingly, in the present embodiment, the shape of the pattern portion 22 of the master template 20 is first measured, and then the drop recipe 151 is corrected according to the measurement result to create a more appropriate drop recipe 151 that corresponds to the actual shape of the pattern portion 22 of the master template 20 rather than simply the expected shape. Hereinafter, a creation method for the drop recipe 151 of the present embodiment will be described.

System Configuration

Figure 9:
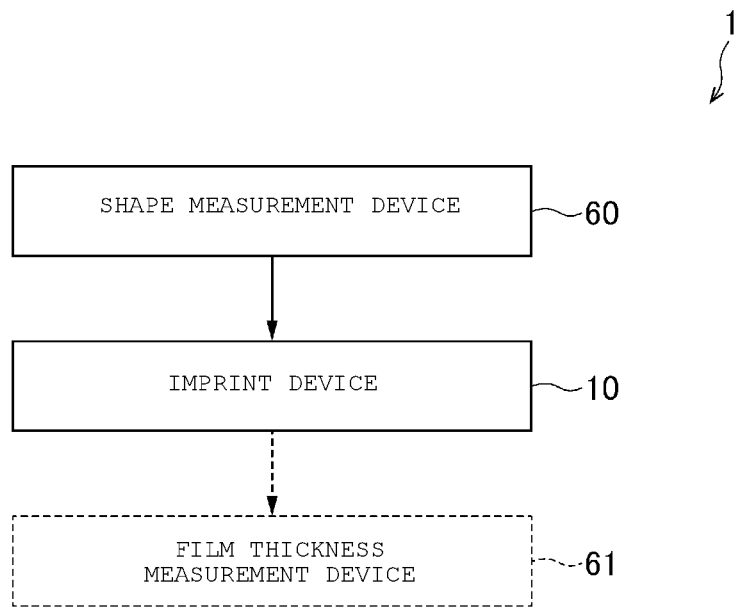
FIG. 9 is a block diagram of an imprint system of a first embodiment.

FIG. 9 shows a schematic configuration of an imprint system 1 of the present embodiment. As shown in FIG. 9, the imprint system 1 includes a shape measurement device 60 in addition to the imprint device 10 shown in FIG. 1.

The shape measurement device 60 is a device capable of measuring the relevant shapes and sizes of the pattern portion 22 of the master template 20. The shape measurement device 60 is a device capable of measuring the shape by using, for example, the critical dimension small angle X-ray scattering (CD-SAXS) method. The shape measurement device 60 using the CD-SAXS method can measure three-dimensional dimensions with an accuracy better than 1 nm. CD-SAXS can measure not only the surface shape but also the internal structure. The shape measurement device 60 can obtain average information over a predetermined area, for example, an average shape within a predetermined area.

Drop Recipe Creation Procedure

Figure 3:
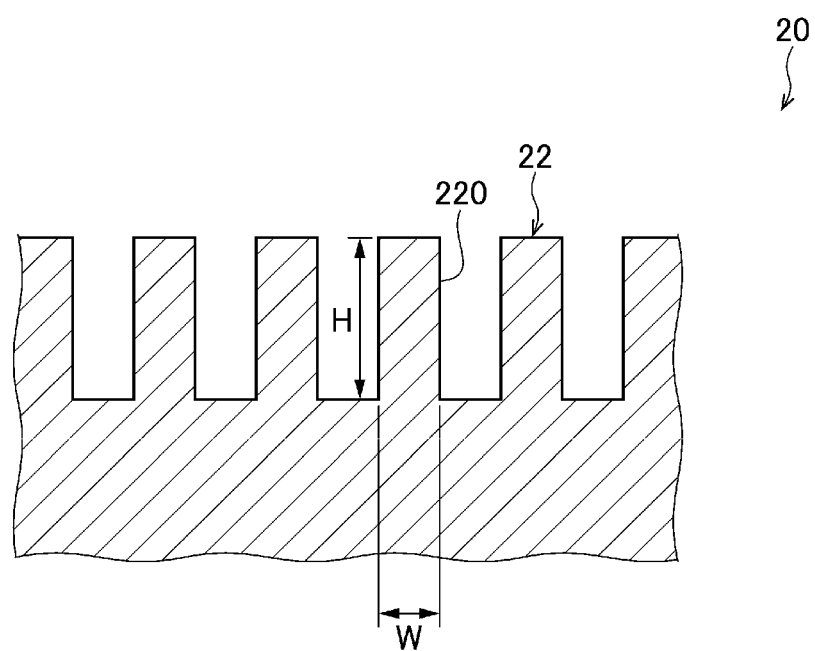
FIG. 3 is a cross-sectional view of a master template of a first embodiment.

Next, a creation procedure for the drop recipe 151 will be described. In the following, a case where each of projection portions 220 of the pattern portion 22 of the master template 20 has the same shape will be described as an example. That is, as depicted in FIG. 3, a height H of each projection portion 220 is the same, and a width W of each projection portion 220 is also the same.

Figure 10:
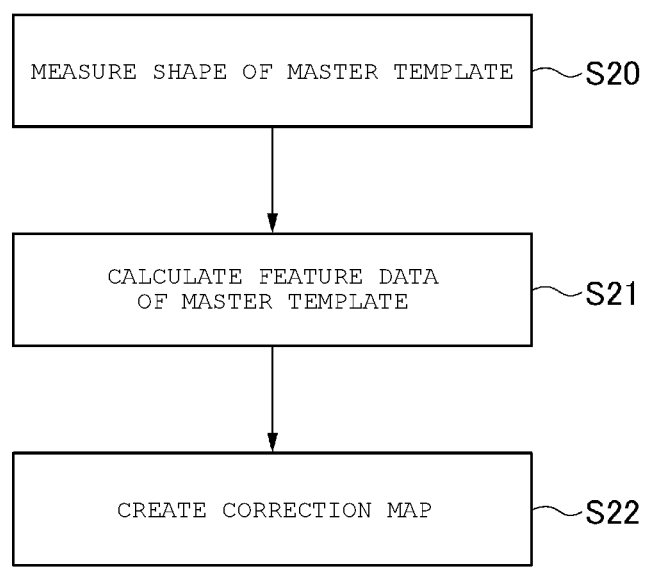
FIG. 10 is a flowchart for creation of a correction map according to a first embodiment.
Figure 11:
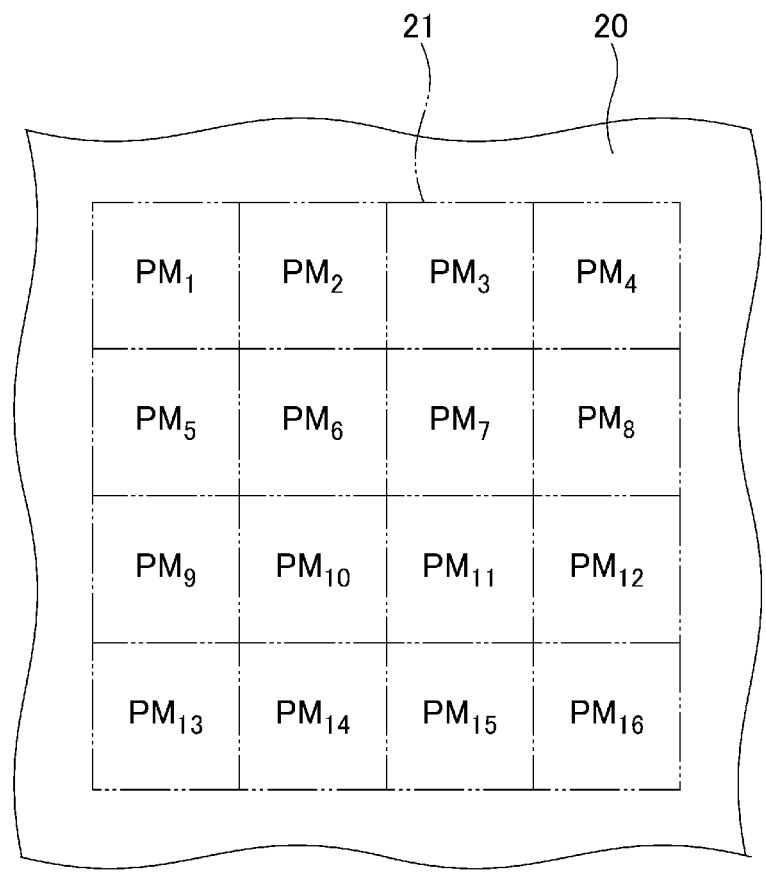
FIG. 11 is a diagram schematically depicting a shot area of a master template of a first embodiment.

As shown in FIG. 10, when creating the drop recipe 151, the shape of the shot area 21 of the master template 20 is first measured by the shape measurement device 60 (step S20). Specifically, as shown by the alternating long and short dash lines in FIG. 11, the shot area 21 is divided, for example, into 16 areas $PM_1$ to $PM_{16}$, and then the shape of the projection portion 220 of the pattern portion 22 in each of the divided areas $PM_1$ to $PM_{16}$ is measured separately by the shape measurement device 60.

Figure 12A:
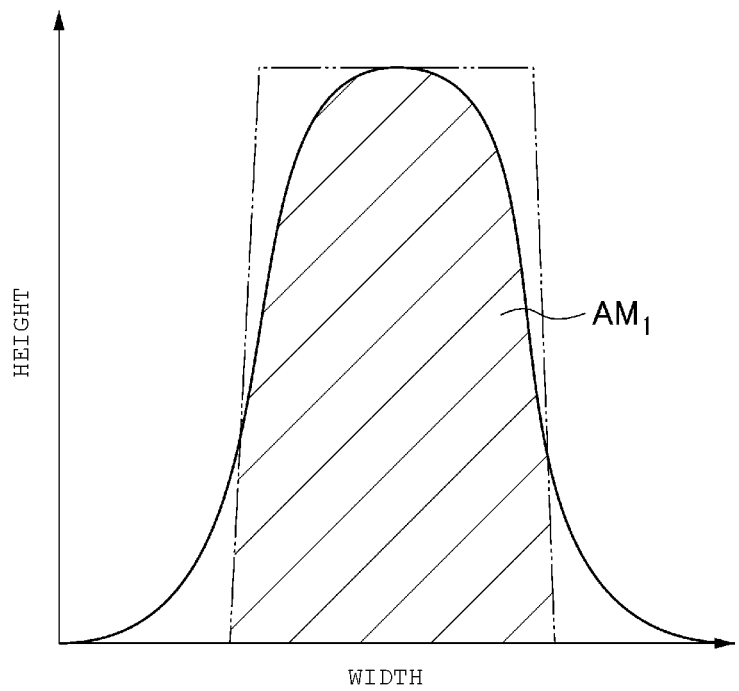
FIGS. 12A and 12B are cross-sectional views depicting an actual cross-sectional shape and an idealized cross-sectional shape of a projecting portion of a master template of a first embodiment.

For example, when the divided area $PM_1$ is measured by the shape measurement device 60, the shape measurement device 60 outputs a cross-sectional shape matching the solid line in FIG. 12A as a measurement result. The cross-sectional shape shown by the solid line in FIG. 12A is taken as the average cross-sectional shape of the projection portion 220 within the divided area $PM_1$ as measured by the shape measurement device 60. The alternating long and short dash line shown in FIG. 12A shows the ideal cross-sectional shape of the projection portion 220. By measuring each shape of the divided areas $PM_1$ to $PM_{16}$ with the shape measurement device 60, the measurement result of the cross-sectional shape such as shown in FIG. 12A can be obtained in each of the plurality of divided areas $PM_1$ to $PM_{16}$.

Next, in the process of FIG. 20, the feature data of the pattern portion 22 of the master template 20 is calculated (step S21) based on the measurement results (from step S20). Specifically, when the shape shown in FIG. 12A is obtained as the average cross-sectional shape of the divided area $PM_1$ in the step S20, the area of the region shown by hatching in FIG. 12A, (actual cross-sectional area $AM_1$ of the projection portion 220) is calculated. The width used when obtaining the actual cross-sectional area $AM_1$ of the projection portion 220 is set in this example to the width of the ideal cross-sectional shape width of the projection portion 220. The ideal cross-sectional shape is, for example, the cross-sectional shape based on design data. In the step S21, the average cross-sectional areas $AM_1$ to $AM_{16}$ of the projection portion 220 in each of the divided areas $PM_1$ to $PM_{16}$ is calculated. In the present embodiment, the information of the cross-sectional areas $AM_1$ to $AM_{16}$ of the projection portions 220 of each of the divided areas $PM_1$ to $PM_{16}$ corresponds to the feature data of the pattern portion 22 of the master template 20.

Figure 12B:
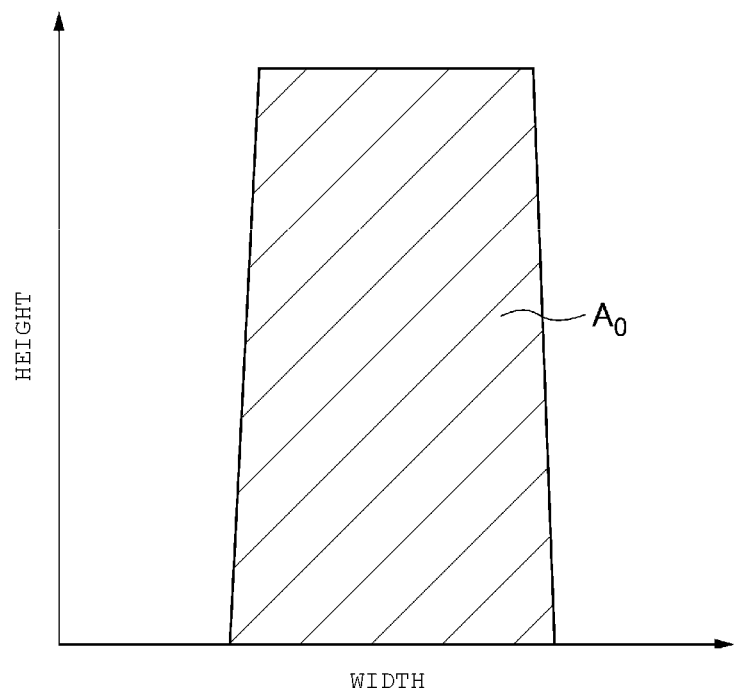

As shown in FIG. 10, a correction map M10 for correcting the dropping amount of the resist 40 applied from the coating device 13 to the substrate 30 is then created (step S22). Specifically, assuming that the ideal shape of the projection portion 220 of the master template 20 is the shape shown in FIG. 12B, the area of the region shown by hatching in FIG. 12B, that is, the value of an ideal cross-sectional area $A_0$ of the projection portion 220 can be obtained from the design data of the master template 20. At this time, a correction value $\alpha_1$ of the dispensing amount of the resist 40 corresponding to the area $PM_1$ is set to "$AM_1/A_0$". That is, assuming that "n=1, 2, ... 16", the correction value $\alpha_n$ of the area $PM_n$ is set based on the following equation:

$$\alpha_n = AM_n/A_0 \quad \text{(equation f1)}$$

As a result, the creation of the correction map M10 (FIG. 13A) is completed. The correction map M10 defines the correction values $\alpha_1$ to $\alpha_{16}$ for the base dropping amount of the resist 40 for each of the divided areas $PM_1$ to $PM_{16}$ in the shot area 21. Each of the correction values $\alpha_1$ to $\alpha_{16}$ of the correction map M10 can be set to a numerical value as shown in FIG. 13B, for example. In the area in which the correction value is set to "1.0", the base (uncorrected) dropping amount is used. In the area in which the correction value is smaller than "1.0", the dropping amount is adjusted to be less than the base dropping amount. In the area in which the correction value is larger than "1.0", the dropping amount is adjusted to be greater than the base dropping amount.

Figure 14:
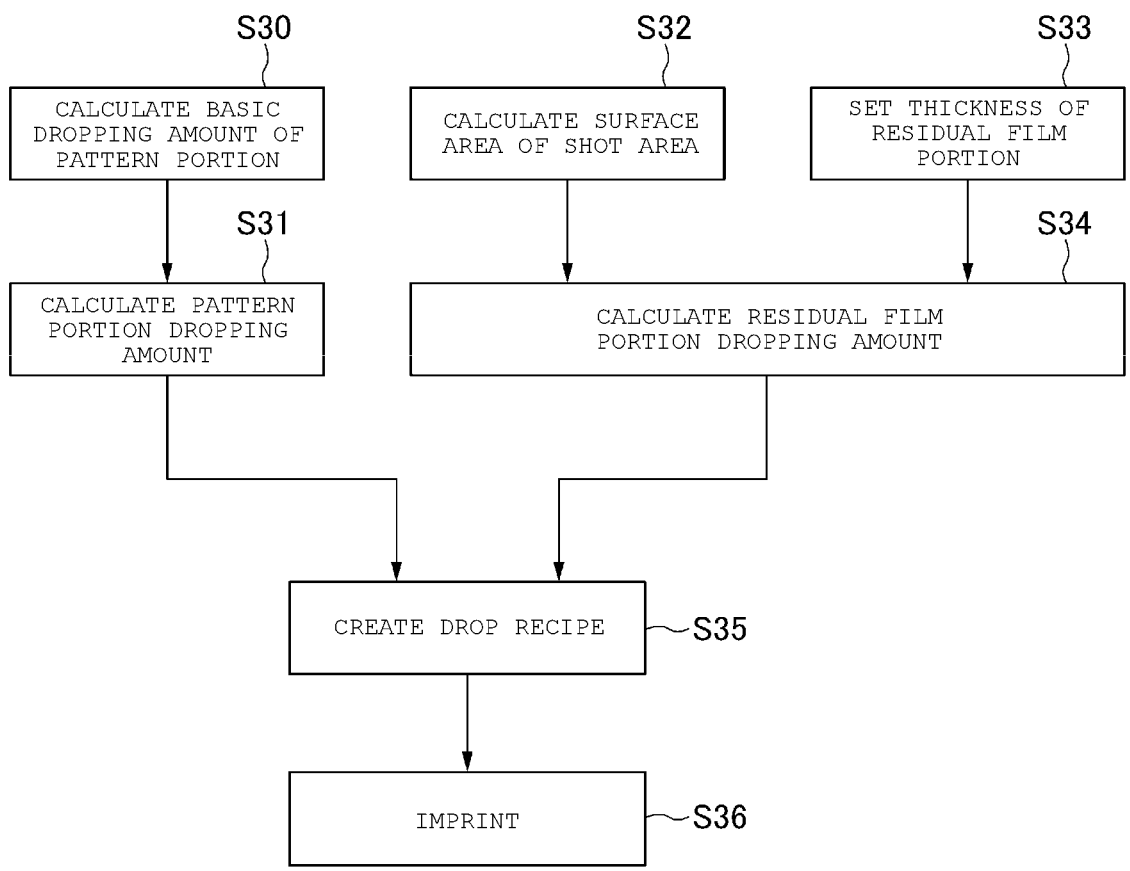
FIG. 14 is a flowchart of a creation method for a droplet recipe according to a first embodiment.

After creating the correction map M10 in this way, the drop recipe 151 can be created by the procedure shown in FIG. 14.

Based on the design data of the master template 20, a basic dropping amount Dpb for the resist 40 is calculated (step S30). Next, based on the calculated basic dropping amount Dpb and the correction map M10 (obtained by the procedure shown in FIG. 10), dropping amounts $Dp_1$ to $Dp_{16}$ corresponding to each of the areas $PM_1$ to $PM_{16}$ of the shot area 21 is calculated (step S31). The following equation:

$$Dp_n = \alpha_n \times Dpb \quad \text{(equation f2)}$$

where n=1 to 16 can be used in step S31.

In parallel with the calculation of the dropping amount $Dp_1$ to $Dp_{16}$, a dropping amount Dr for the resist residual film portion 41 can also be calculated. Specifically, the surface area of the shot area 21 is calculated from the design data of the master template 20 (step S32). Then, the target thickness of the resist residual film portion 41 is set (step S33). The target thickness of the resist residual film portion 41 can be set according to subsequent processing parameters or the like.

After the steps S32 and S33, the dropping amount Dr for the resist residual film portion 41 can be calculated based on the surface area of the shot area 21 and the target thickness of the resist residual film portion 41 (step S34). The surface area of the shot area 21 of the master template 20 is generally substantially equal to the surface area of the mesa portion 31 of the substrate 30. Accordingly, the dropping amount Dr can be calculated by multiplying the surface area of the shot area 21 by the thickness of the resist residual film portion 41.

In this way, after calculating the pattern portion dropping amount $Dp_1$ to $Dp_{16}$ and the residual film portion dropping amount Dr, the drop recipe 151 can be created by combining these values, respectively (step S35). After storing the drop recipe 151 in the storage device 150 of the control device 15, the imprint device 10 is driven to imprint the dispensed resist 40 on the substrate 30 (step S36).

Effect

As described above, the creation method of the drop recipe 151 of the present embodiment has a measurement step (step S20; FIG. 10), the dropping amount calculation step (steps S31 and S34; FIG. 14), and the drop recipe creation step (step S35). The measurement step of the step S20 is a step of acquiring the cross-sectional area of the projecting portion 220, which is feature data of the master template 20, by measuring the shape on the master template 20. The dropping amount calculation step of the step S31 is a step of calculating the pattern portion dropping amounts $Dp_1$ to $Dp_{16}$ based on the cross-sectional area of the projecting portion 220 of the master template 20. The dropping amount calculation step of step S34 is a step of calculating the residual film portion dropping amount Dr. The drop recipe creation step of the step S35 is a step of creating the drop recipe 151 based on the pattern portion dropping amounts $Dp_1$ to $Dp_{16}$ and the residual film portion dropping amount Dr. According to this method, it is possible to create a more appropriate drop recipe 151 corresponding to the actual shape of the master template 20.

In the measurement step of the step S20, the cross-sectional shape of each of the plurality of areas $PM_1$ to $PM_{16}$ in the shot area 21 is measured. In other words, on the master template 20, the cross-sectional shapes of a plurality of points in the pattern portion 22 are measured. According to this method, it is possible to acquire more appropriate feature data for the master template 20.

MODIFICATION EXAMPLE

In the measurement step of the step S20, the cross-sectional shape of just one representative area of the areas $PM_1$ to $PM_{16}$ in the shot area 21 of the master template 20 could be measured. That is, only one point on the surface of the master template 20 on which the pattern portion 22 is formed could be measured and this representative value may be used for each of the areas $PM_1$ to $PM_{16}$.

Second Embodiment

The differences from the first embodiment will be mainly described in this context.

Figure 15:
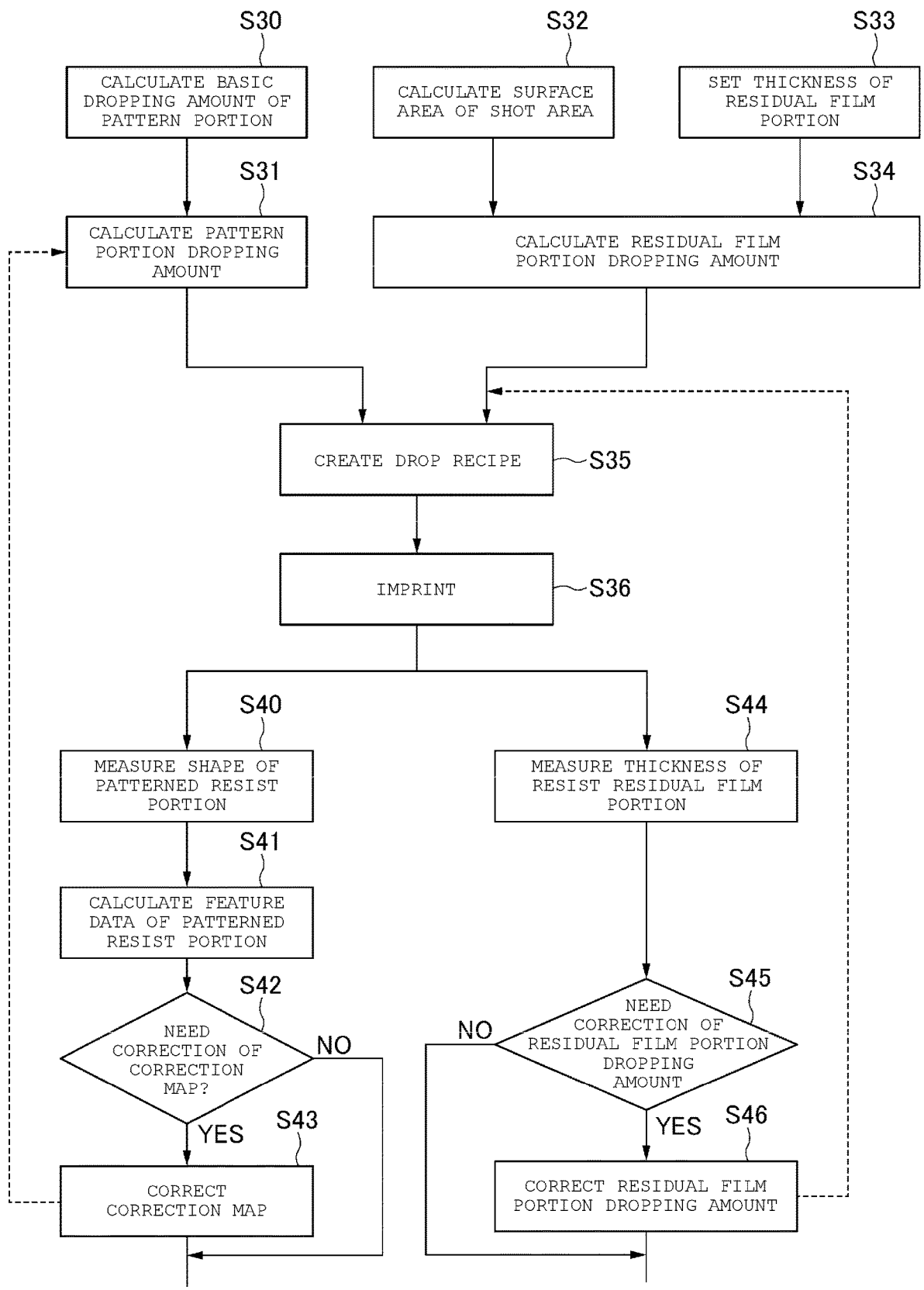
FIG. 15 is a flowchart of a creation method of a droplet recipe according to a second embodiment.

As shown in FIG. 15, in the creation method of the drop recipe 151 of the second embodiment, the resist 40 is imprinted on the substrate 30 in the step S36, and then the shape of the patterned resist portion 42 of the substrate 30 that has been imprinted is measured by the shape measurement device 60 (step S40). Based on this measurement result, the cross-sectional area of a projection portion 420 formed in the patterned resist portion 42 (as shown in FIG. 8B) is calculated (step S41). The respective steps S40 and S41 correspond to the steps S20 and S21 (FIG. 10) but are performed on the substrate 30 rather than the master template 20. In the steps S40 and S41, the average cross-sectional areas $AR_1$ to $AR_{16}$ of the projection portions 420 corresponding to the areas $PR_1$ to $PR_{16}$ are calculated. In the present embodiment, the information of the cross-sectional areas $AR_1$ to $AR_{16}$ of the projection portion 420 of each of the divided areas $PR_1$ to $PR_{16}$ corresponds to the feature data of the transfer pattern portion.

Following the step S41, it is determined whether a correction map M10 needs to be adjusted (step S42). Specifically, each of the cross-sectional areas $AR_1$ to $AR_{16}$ is compared with the ideal cross-sectional area $A_0$ of the projection portion 220 of the master template 20, and when any of the cross-sectional areas $AR_1$ to $AR_{16}$ deviates from the ideal cross-sectional area $A_0$ by some predetermined threshold value or more, it is determined that the correction map M10 needs to be corrected (step S42: YES). In this case, the correction map M10 is corrected (step S43). For example, when the cross-sectional area $AR_1$ deviates from the ideal cross-sectional area $A_0$, a correction value $\alpha_1$ of the correction map M10 is set so that the deviation amount becomes small. After the correction map M10 is corrected in this way, the corrected correction map M10 can be used when the imprint processing is performed thereafter. By using the corrected correction map M10, the pattern portion dropping amount $Dp_1$ to $Dp_{16}$ is corrected.

In the process of step S42, when none of the cross-sectional areas $AR_1$ to $AR_{16}$ deviate from the ideal cross-sectional area $A_0$ by the predetermined threshold value or more, the correction map M10 is not adjusted. That is, in this case, the same correction map M10 is used when the imprint processing is performed thereafter.

The process of the steps S44 to S46 can be performed in parallel with the process of the steps S40 to S43. In the process of the step S44, the actual thickness of the resist residual film portion 41 of the substrate 30 on which the resist 40 has been imprinted can be measured. As shown by the alternate long and dash line box in FIG. 9, the imprint system 1 of the second embodiment further includes a film thickness measurement device 61 capable of measuring the thickness of the resist residual film portion 41. The film thickness measurement device 61 is, for example, an optical film thickness measuring device. In the process of the step S44, for example, several hundred points on the resist residual film portion 41 on the transfer surface 32 of the substrate 30 shown in FIG. 4 are measured by the film thickness measurement device 61, and then the average value can be used as the actual thickness of the resist residual film portion 41.

Following the process of the step S44, it is determined whether the residual film portion dropping amount Dr needs to be adjusted (step S45). Specifically, the actual thickness of the resist residual film portion 41 obtained in the process of the step S44 is compared with the previously set value for the thickness of the resist residual film portion 41 set in the process of the step S33, and when the actual thickness of the resist residual film portion 41 deviates from the set value by a predetermined value or more, it is determined to correct the residual film portion dropping amount Dr (step S45: YES). In this case, the residual film portion dropping amount Dr is corrected so that the deviation amount between the actual thickness of the resist residual film portion 41 and the set value becomes small (step S46). After the residual film portion dropping amount Dr is adjusted in this way, the corrected residual film portion dropping amount Dr can be used when the imprint processing is performed thereafter.

If it is determined in the process of the step S45 that the residual film portion dropping amount Dr does not need adjustment (step S45: NO), the residual film portion dropping amount Dr is not changed. That is, in this case, the same residual film portion dropping amount Dr is used when the imprint processing is performed thereafter.

The creation method of the drop recipe 151 shown in FIG. 15 can be used for any substrates 30 that are subsequently molded. Accordingly, each time a substrate 30 is patterned, the correction map M10 and the residual film portion dropping amount Dr can be feedback-corrected according to the shape of the resist residual film portion 41 and the patterned resist portion 42 for the substrate 30 specifically.

Effect

As described above, the creation method of the drop recipe 151 of the second embodiment further has the measurement step of the step S40 and the correction step of the step S43. The measurement step of the step S40 is a step of acquiring the cross-sectional area of the projection portion 420, which is the feature data of the patterned resist portion 42, by measuring the patterned resist portion 42 formed on a substrate 30. The correction step of the step S43 is a step of correcting the pattern portion dropping amount $Dp_1$ to $Dp_{16}$ by adjusting the correction map M10 based on the cross-sectional areas of the projection portion 420 of the patterned resist portion 42. According to this method, it is possible to feedback-correct the pattern portion dropping amount $Dp_1$ to $Dp_{16}$ according to the shape of the patterned resist portion 42 of the substrates 30 to be subsequently molded.

In the measurement step of the step S40, the feature data of the patterned resist portion 42 is acquired by measuring the cross-sectional shape of each of the plurality of divided areas $PR_1$ to $PR_{16}$ set on the transfer surface 32 of the substrate 30. According to this method, it is possible to obtain more appropriate and detailed feature data of the patterned resist portion 42.

The creation method of the drop recipe 151 of the second embodiment further has the measurement step of the step S44 and the correction step of the step S46. The measurement step of the step S44 is a step of acquiring the thickness by measuring the resist residual film portion 41 formed on the substrate 30. The correction step of the step S46 is a step of correcting the residual film portion dropping amount Dr based on the measured thickness of the resist residual film portion 41. According to this method, it is possible to feedback-correct the residual film portion dropping amount Dr according to the thickness of the resist residual film portion 41 of a substrate 30 to be subsequently molded.

In the measurement step of the step S44, the thickness of the resist residual film portion 41 is acquired by measuring a plurality of points on the transfer surface 32 of the substrate 30. According to this method, it is possible to obtain a more appropriate thickness of the resist residual film portion 41.

First Modification Example

In the measurement step of the step S40, the cross-sectional shape of the area of any one of the plurality of divided areas $PM_1$ to $PM_{16}$ set on the transfer surface 32 of the substrate 30 may be measured. That is, on the master template 20, only one point of the pattern portion 22 need be measured.

Second Modification Example

In the measurement step of the step S44, the thickness of the resist residual film portion 41 may be measured at only at one representative point on the transfer surface 32 of the substrate 30.

Third Modification Example

In the correction step of the step S43, the correction map M10 may be corrected by correcting the information of the cross-sectional areas $AM_1$ to $AM_{16}$ of the projection portion 220 of the master template 20 calculated in the processing of the step S21 (FIG. 10). Specifically, based on the cross-sectional areas $AR_1$ to $AR_{16}$ measured in the measurement step of the step S40, the information of the cross-sectional area $AM_1$ to $AM_{16}$ of the projection portion 220 of the master template 20 is corrected. Then, the correction map M10 is corrected by performing the calculation of the above equation f1 again based on the information of the cross-sectional areas $AM_1$ to $AM_{16}$ after the correction. In this modification, the process of the step S43 corresponds to the process of correcting the feature data of the master template 20 based on the feature data of the patterned resist portion 42.

OTHER EMBODIMENTS

The present disclosure is not limited to the above specific examples.

For example, the measurement step of the step S20 is not limited to the step of measuring the cross-sectional area of the projection portion 220 as the feature data of the master template 20, but may be a step of measuring, for example, the width, height, or the like of the projection portion 220.

Similarly, the measurement step of the step S40 is not limited to the step of measuring the cross-sectional area of the projection portion 420 as the feature data of the patterned resist portion 42 of the substrate 30, and may be, for example, a step of measuring the width, height, or the like of the projection portion 420.

The imprint device 10 is not limited to a device that forms a pattern portion on a replica template by using the master template 20, and may be, for example, a device that forms a pattern portion on a silicon wafer or the like by using the master template 20 or the replica template.

The disclosed creation method of a drop recipe of the above embodiment may also be used in manufacturing a semiconductor device.

Figure 16A:
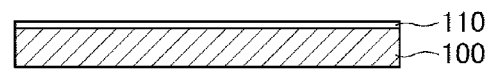
FIGS. 16A to 16G are cross-sectional views showing aspects related to a manufacturing method of a semiconductor device.
Figure 16B:
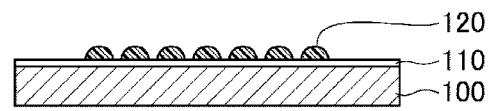
Figure 16C:
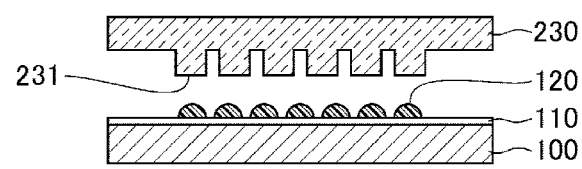
Figure 16D:
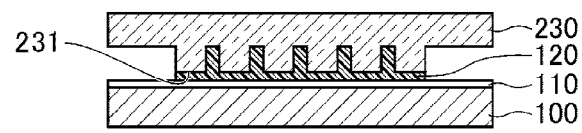
Figure 16E:
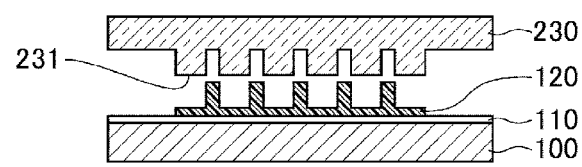
Figure 16F:
Figure 16G:

Specifically, when manufacturing a semiconductor device, a processing target film 110 is formed on a semiconductor substrate 100 as shown in FIG. 16A, and then as shown in FIG. 16B, the resin 120 is dropped onto the processing target film 110. Then, as shown in FIG. 16C, a template 230 is made to face the processing target film 110, and then a pattern 231 of the template 230 is brought into contact with the resin 120 on the substrate 100 as shown in FIG. 16D by raising the substrate stage or the like. Then, the resin 120 is cured by irradiating the resin 120 with ultraviolet light from the light source while still in the state shown in FIG. 16D. Subsequently, as shown in FIG. 16E, the substrate 100 and the template 230 are separated from each other, and then etching is performed on the substrate 100. In the etching, the processing target film 110 is etched using the resin 120 as a mask. FIG. 16F schematically shows the cross-sectional structure of the substrate 100 immediately after the etching is performed. FIG. 16G schematically shows a cross-sectional structure of the substrate 100 from which the resin 120 has been removed by asking. Through such a process, a predetermined pattern is formed on the substrate 100.

In such a manufacturing method of a semiconductor device, a droplet recipe is used for dispensing the resin 120 onto the processing target film 110. As a creation method of the droplet recipe, it is possible to use the methods according to the above-described embodiments. Likewise, such droplet recipe creation methods may be used not only for the manufacturing of a semiconductor device but for any pattern formation for device fabrication.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for generating a droplet recipe used in imprint lithography, the method comprising:
   acquiring feature data for a pattern shape formed on a template by measuring the pattern shape of a pattern formed on the template;
   calculating, based on the acquired feature data, a dispensing amount for resin to be dispensed on a substrate for filling of the pattern of the template during imprinting of the pattern of the template on the substrate;
   calculating a dispensing amount for resin corresponding to a target thickness of a residual film portion formed on the substrate during the imprinting of the pattern of the template on the substrate;
   generating, based on the calculated dispensing amounts, a droplet recipe for dispensing of resin during imprinting of the pattern of the template; and
   generating an updated droplet recipe based on measurement of a transferred pattern feature formed on the substrate by imprinting of the pattern of the template performed using the previously generated droplet recipe.

2. The method according to claim 1, wherein the feature data is acquired by measuring a pattern feature on a surface of the template.

3. The method according to claim 1, wherein the feature data is acquired by measuring a transferred pattern feature formed on the substrate by the imprinting of the pattern of the template on the substrate.

4. A method for generating a droplet recipe used in imprint lithography, the method comprising:
   acquiring feature data for a pattern shape formed on a template by measuring the pattern shape of a pattern formed on the template;
   calculating, based on the acquired feature data, a dispensing amount for resin to be dispensed on a substrate for filling of the pattern of the template during imprinting of the pattern of the template on the substrate;
   calculating a dispensing amount for resin corresponding to a target thickness of a residual film portion formed on the substrate during the imprinting of the pattern of the template on the substrate;
   generating, based on the calculated dispensing amounts, a droplet recipe for dispensing of resin during imprinting of the pattern of the template;
   measuring a transferred pattern feature formed on the substrate by imprinting of the pattern of the template; and
   correcting the feature data based on the measurement of the transferred pattern on the substrate.

5. The method according to claim 4, wherein the feature data is acquired by measuring a cross-sectional shape of a transferred pattern feature formed on the substrate.

6. A method for generating a droplet recipe used in imprint lithography, the method comprising:
   acquiring feature data for a pattern shape formed on a template by measuring the pattern shape of a pattern formed on the template;
   calculating, based on the acquired feature data, a dispensing amount for resin to be dispensed on a substrate for filling of the pattern of the template during imprinting of the pattern of the template on the substrate;
   calculating a dispensing amount for resin corresponding to a target thickness of a residual film portion formed on the substrate during the imprinting of the pattern of the template on the substrate;
   generating, based on the calculated dispensing amounts, a droplet recipe for dispensing of resin during imprinting of the pattern of the template;
   measuring a thickness of the residual film portion formed on the substrate by imprinting of the template using the droplet recipe; and
   generating an updated droplet recipe based on the measured thickness of the residual film portion.

7. The method according to claim 6, wherein the thickness of the residual film portion is measured at a plurality of points.

8. A pattern forming method, comprising:
   performing imprinting of a template pattern on a target film using a droplet recipe, the template pattern being formed in a template; and
   processing the target film using the imprinted template pattern, wherein
   the droplet recipe is generated by:
   acquiring feature data for the template pattern formed on the template by measuring a pattern shape of the template pattern;
   calculating, based on the acquired feature data, a dispensing amount for resin to be dispensed for filling of the template pattern during the imprinting of the template pattern;
   calculating a dispensing amount for resin corresponding to a target thickness of a residual film portion formed during the imprinting of the template pattern;
   generating, based on the calculated dispensing amounts, the droplet recipe for dispensing of resin for the imprinting of the template pattern;
   measuring a transferred pattern feature formed by imprinting of the template pattern on a substrate; and
   correcting the feature data based on the measurement of the transferred pattern on the substrate.

9. The pattern forming method according to claim 8, wherein the feature data is acquired by measuring a pattern feature on a surface of the template.

10. The pattern forming method according to claim 8, wherein the feature data is acquired by measuring a transferred pattern feature formed by the imprinting of the template pattern.

11. The pattern forming method according to claim 8, further comprising:
    measuring a thickness of the residual film portion formed on a substrate by imprinting of the template pattern.

12. The pattern forming method according to claim 8, further comprising:
    transferring the template pattern into the target film by etching of the target film using the imprinted template pattern as a mask.

13. The pattern forming method according to claim 8, wherein the template is quartz glass.

14. A manufacturing method of a semiconductor device, the method comprising:

forming a processing target film on a semiconductor substrate;

performing imprinting of a template pattern on the processing target film using a droplet recipe, the template pattern being formed in a template; and processing the target film using the imprinted template pattern as a mask, wherein the droplet recipe is generated by:

acquiring feature data for the template pattern formed on the template by measuring a pattern shape of the template pattern;

calculating, based on the acquired feature data, a dispensing amount for resin to be dispensed for filling of the template pattern during the imprinting of the template pattern;

calculating a dispensing amount for resin corresponding to a target thickness of a residual film portion formed during the imprinting of the template pattern;

generating, based on the calculated dispensing amounts, the droplet recipe for dispensing of resin for the imprinting of the template pattern;

measuring a transferred pattern feature formed by imprinting of the template pattern on the semiconductor substrate; and correcting the feature data based on the measurement of the transferred pattern on the semiconductor substrate.

15. The manufacturing method according to claim 14, wherein the feature data is acquired by measuring a pattern feature on a surface of the template.

16. The manufacturing method according to claim 14, wherein the feature data is acquired by measuring a transferred pattern feature formed by the imprinting of the template pattern.

17. The manufacturing method according to claim 14, wherein the semiconductor substrate is a silicon wafer.

* * * * *